United States Patent
Ohnishi et al.

(10) Patent No.: US 7,091,099 B2
(45) Date of Patent: Aug. 15, 2006

(54) BIPOLAR TRANSISTOR AND METHOD FOR FABRICATING THE SAME

(75) Inventors: Teruhito Ohnishi, Osaka (JP); Koichiro Yuki, Kyoto (JP); Tsuneichiro Sano, Osaka (JP); Tohru Saitoh, Osaka (JP); Ken Idota, Osaka (JP); Takahiro Kawashima, Osaka (JP); Shigeki Sawada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 4 days.

(21) Appl. No.: 10/807,307

(22) Filed: Mar. 24, 2004

(65) Prior Publication Data
US 2004/0195655 A1    Oct. 7, 2004

(30) Foreign Application Priority Data
Mar. 25, 2003    (JP) .............................. 2003-082421

(51) Int. Cl.
*H01L 21/331*    (2006.01)
(52) U.S. Cl. ...................... 438/320; 438/309; 438/312; 438/350; 257/E21.35
(58) Field of Classification Search ................ 438/309, 438/312, 320, 350, 508; 257/E21.35
See application file for complete search history.

(56) References Cited

U.S. PATENT DOCUMENTS 5,834,800 A    11/1998    Jalali-Farahani et al.
6,586,818 B1 *  7/2003    Voldman ..................... 257/587
6,830,982 B1 * 12/2004    Howard et al. ............. 438/320
2002/0158311 A1 * 10/2002    Ohnishi et al. ............. 257/591

FOREIGN PATENT DOCUMENTS

| JP | 9-186172 | 7/1997 |
| JP | 09-326399 | 12/1997 |
| JP | 11307540 A | 11/1999 |
| JP | 2001-319936 A | 11/2001 |
| JP | 3352941 | 9/2002 |

* cited by examiner

*Primary Examiner*—Zandra V. Smith
*Assistant Examiner*—Christy Novacek
(74) *Attorney, Agent, or Firm*—McDermott Will & Emery llp

(57) ABSTRACT

A bipolar transistor includes a Si single crystalline layer serving as a collector, a single crystalline Si/SiGeC layer and a polycrystalline Si/SiGeC layer which are formed on the Si single crystalline layer, an oxide film having an emitter opening portion, an emitter electrode, and an emitter layer. An intrinsic base layer is formed on the single crystalline Si/SiGeC layer, part of the single crystalline Si/SiGeC layer, the polycrystalline Si/SiGeC layer and the Co silicide layer together form an external base layer. The thickness of the emitter electrode is set so that boron ions implanted into the emitter electrode and diffused therein do not reach an emitter-base junction portion.

8 Claims, 15 Drawing Sheets

BIPOLAR TRANSISTOR AND METHOD FOR FABRICATING THE SAME

BACKGROUND OF THE INVENTION

The present invention relates to a bipolar transistor and a method for fabrication the same, and more particularly relates to a structure for a high-performance bipolar transistor including a hetero-junction such as Si/SiGe and Si/SiGeC and a method for fabricating the same.

Hetero-junction bipolar transistors have been used as communication devices such as mobile communications requiring high-speed operation characteristic and high integration because hetero-junction bipolar transistors have excellent high-speed operation characteristic and high current driving ability, compared to Si homo-junction bipolar transistors. Specifically, in recent years, a hetero-junction bipolar transistor (which will be herein referred to as an "HBT") of which cutoff frequency is over 100 GHz has been achieved by making a bipolar transistor include a hetero-junction structure such as Si/SiGe and Si/SiGeC.

As a known example of methods for fabricating such a hetero-junction bipolar transistor, a method disclosed in Reference 1 (Japanese Laid-Open Patent Publication No. 9-186172) has been known.

Features of the known method for fabricating an HBT are that ion implantation is performed to an external base layer (a polycrystalline SiGe film) and that influence of lateral diffusion of an impurity which has been ion-implanted into a polysilicon emitter electrode (an emitter contact layer) is reduced by providing a spacer. In this case, the thickness of a polysilicon film of the polysilicon emitter electrode is about 140 nm. As for conditions for additional ion implantation into the external base layer, the acceleration energy is 60 keV and the dose is $2\times10^{15}$ cm$^{-2}$ when boron (B) ions are implanted and the acceleration energy is 30 keV and the dose is $1\times10^{15}$ cm$^{-2}$ when boron fluoride (BF$_2$) ions are implanted.

SUMMARY OF THE INVENTION

However, with the known HBT structure, when boron ions are additionally implanted into the external base layer using the emitter electrode as an injection mask, boron ions, i.e., ions of an impurity of the opposite conductive type to that of an emitter, are also implanted into the emitter electrode. To avoid this, the amount of boron doped into the external base layer has to be reduced, thus resulting in increase in the electric resistance of the external base layer. Moreover, as factors of determining the shape of the emitter, there are two types of restrictions, i.e., restrictions on alignment margins of a contact hole and like restrictions for processing, and restrictions due to the above-described electric properties. Basically, these two types of restrictions are difficult to achieve at the same time. Therefore, in the known HBT, it is difficult to achieve both of improved high-speed operation characteristic and high current driving ability at the same time.

It is therefore an object of the present invention to provide a bipolar transistor of which the high-speed operation characteristic and high current driving ability can be increased at the same time by improving the structures of an emitter electrode and an external base layer, and a method for fabricating the same.

A bipolar transistor according to the present invention is a bipolar transistor which includes a hetero-junction as an emitter-intrinsic base junction portion and in which an emitter electrode has a thickness with which ions of an impurity implanted into the emitter electrode to form the external base layer are diffused so that the concentration of the impurity is a low level in a lower portion of the emitter electrode.

Thus, reduction in the current driving ability of the bipolar transistor due to diffusion of an impurity from an external base into the emitter-intrinsic base junction portion can be prevented while the impurity concentration of the external base layer is increased to reduce the base resistance. Therefore, properties such as high-speed operation characteristic and high current driving ability can be achieved.

The thickness of the emitter electrode is in a range between not less than 200 nm and not more than 500 nm. Thus, a recess formed in part of an upper surface of the emitter electrode located over the emitter opening portion can be made to be as small as possible. Therefore, increase in the resistance of the silicide layer of the emitter electrode can be suppressed.

The recess formed in the part of the upper surface of the emitter electrode preferably has an aspect ratio of 1/5 or less.

Ions of the second-conductive-type impurity are implanted into a region of the external base layer extending from a position on a side of and under the emitter electrode to a distance of 230 nm from a boundary portion of the substrate between an emitter layer and an intrinsic base layer. Thus, the base resistance can be reduced without giving adverse effects to properties of the bipolar transistor.

A conductor plug formed so as to pass through the interlevel insulating film is in contact with each of the isolation layers of the external base layer. Thus, a pass-through of the conductor plug into the first semiconductor layer can be prevented.

A method for fabricating a bipolar transistor according to the present invention is a method in which on a first semiconductor layer of the first conductive type surrounded by isolation layers, a second semiconductor layer of the second conductive type, a third semiconductor layer, an insulating film having an emitter opening portion, and an emitter electrode containing an impurity of the first conductive type are formed in this order and also using the emitter electrode and the insulating film as masks, ions of an impurity of the second conductive type are implanted into the second and third semiconductor layers from a direction tilted from a perpendicular direction with respect to a surface of a substrate.

According this method, ions of the second-conductive-type impurity can be implanted part of the substrate close to regions of the second and third semiconductor layers located directly under the emitter opening portion which is to be an intrinsic base layer. Thus, the base resistance can be reduced. Moreover, electric properties and the layout of the emitter electrode can be independently optimized.

When ions of an impurity of the second conductive type are implanted into the second and third semiconductor layers, implantation of ions of the second-conductive-type impurity is performed under the condition in which the second-conductive-type impurity does not go over a point of 230 nm from the boundary between the emitter layer and the second semiconductor layer to reach a portion of the substrate located closer to the emitter layer. Thus, adverse effects to properties of a bipolar transistor can be avoided.

A polycrystalline layer to be an emitter electrode preferably has a thickness of not less than 200 nm and not more than 500 nm.

DESCRIPTION OF THE PREFERRED EMBODIMENTS

First Embodiment

Figure 1:
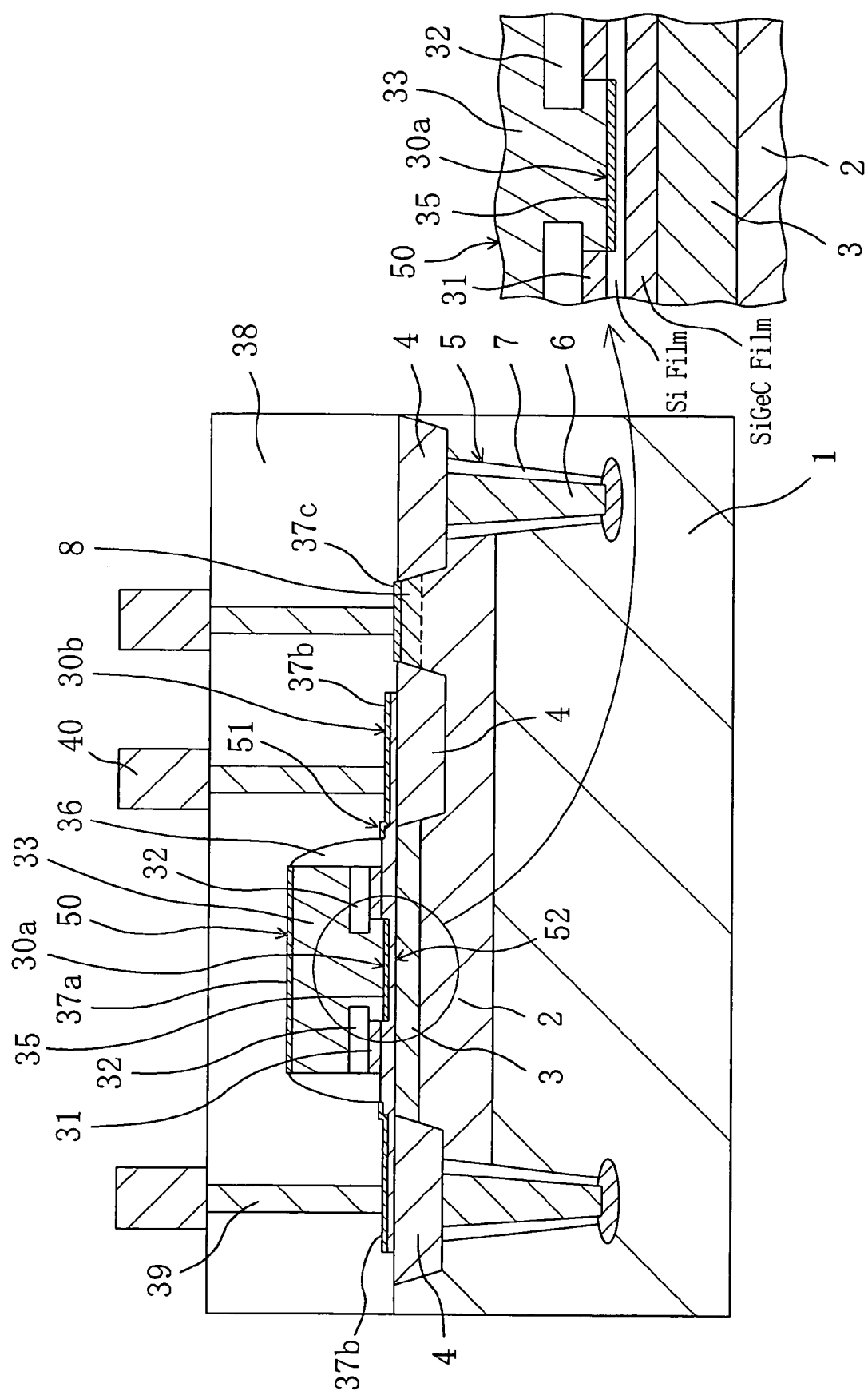
FIG. 1 is a cross-sectional view of a bipolar transistor according to a first embodiment of the present invention.

Hereinafter, a first embodiment of the present invention will be described in detail with reference to the accompanying drawings. FIG. 1 is a cross-sectional view of a bipolar transistor according to the first embodiment of the present invention.

As shown in FIG. 1, a hetero-junction bipolar transistor (HBT) of this embodiment includes, in a substrate, a p-type Si substrate 1, a sub-collector layer 2 formed in a surface portion of the Si substrate 1, a Si single crystalline layer 3 which is epitaxially grown on the sub-collector layer 2 and functions as a collector, a shallow trench 4 formed of a silicon oxide film, a deep trench 5 which is formed under the shallow trench 4 and includes a silicon oxide film 7 and a polysilicon film 6, and an n+ type collector lead layer 8 formed in a portion of the sub-collector layer 2 located between shallow trenches 4.

Furthermore, the bipolar transistor includes a single crystalline Si/SiGeC layer 30a and a polycrystalline Si/SiGeC layer 30b which are formed on the Si single crystalline layer 3, an oxide film 31 which is formed on the single crystalline Si/SiGeC layer 30a and has an emitter opening portion, a polysilicon film 32 which is formed on the oxide film 31 and has an emitter opening portion, an emitter electrode 50 formed so as to fill the emitter opening portion and be in contact with the single crystalline Si/SiGeC layer 30a, an emitter layer 35 formed in an upper portion of the single crystalline Si/SiGeC 30a, a sidewall 36 formed of a silicon oxide film on side surfaces of the emitter electrode 50, the polysilicon film 32, and the oxide film 31, and silicide layers 37a, 37b and 37c formed on upper portions of the emitter electrode 50, the Si/SiGeC layers 30a and 30b, and the n+ type collector lead layer 8, respectively. In this case, part of the single crystalline Si/SiGeC layer 30a located between the emitter layer 35 and the Si single crystalline layer 3 (a collector layer) serves as an intrinsic base layer 52. Moreover, other part of the Si/SiGeC layer 30a than the part thereof serving as the intrinsic base layer 52, the polycrystalline Si/SiGeC layer 30b, and a Co silicide layer 37b together form an external base layer 51. Note that the SiGeC film of this embodiment has a gradient composition in which the band gap gradually decreases from the emitter side to the collector side and is precisely expressed by $Si_{1-x-y}Ge_xC_y$.

Moreover, on the substrate, provided are an interlevel insulating film 38 which covers the emitter electrode 50 and the external base layer 51 and is formed of a silicon oxide film, a W plug 39 formed so as to pass through the interlevel insulating film 38, reach the emitter electrode 50 of the HBT, the external base layer 51 and each Co silicide layer 37 of the n+ type collector lead layer 8 and fill a via hole, and a metal interconnect 40 formed of an aluminum alloy film connected to each W plug 39 on the interlevel insulating film 38.

Next, a method for fabricating a semiconductor device according to the first embodiment of the present invention will be described. FIGS. 2 through 12 are cross-sectional views illustrating respective steps for fabricating the bipolar transistor of the first embodiment of the present invention.

Figure 2:
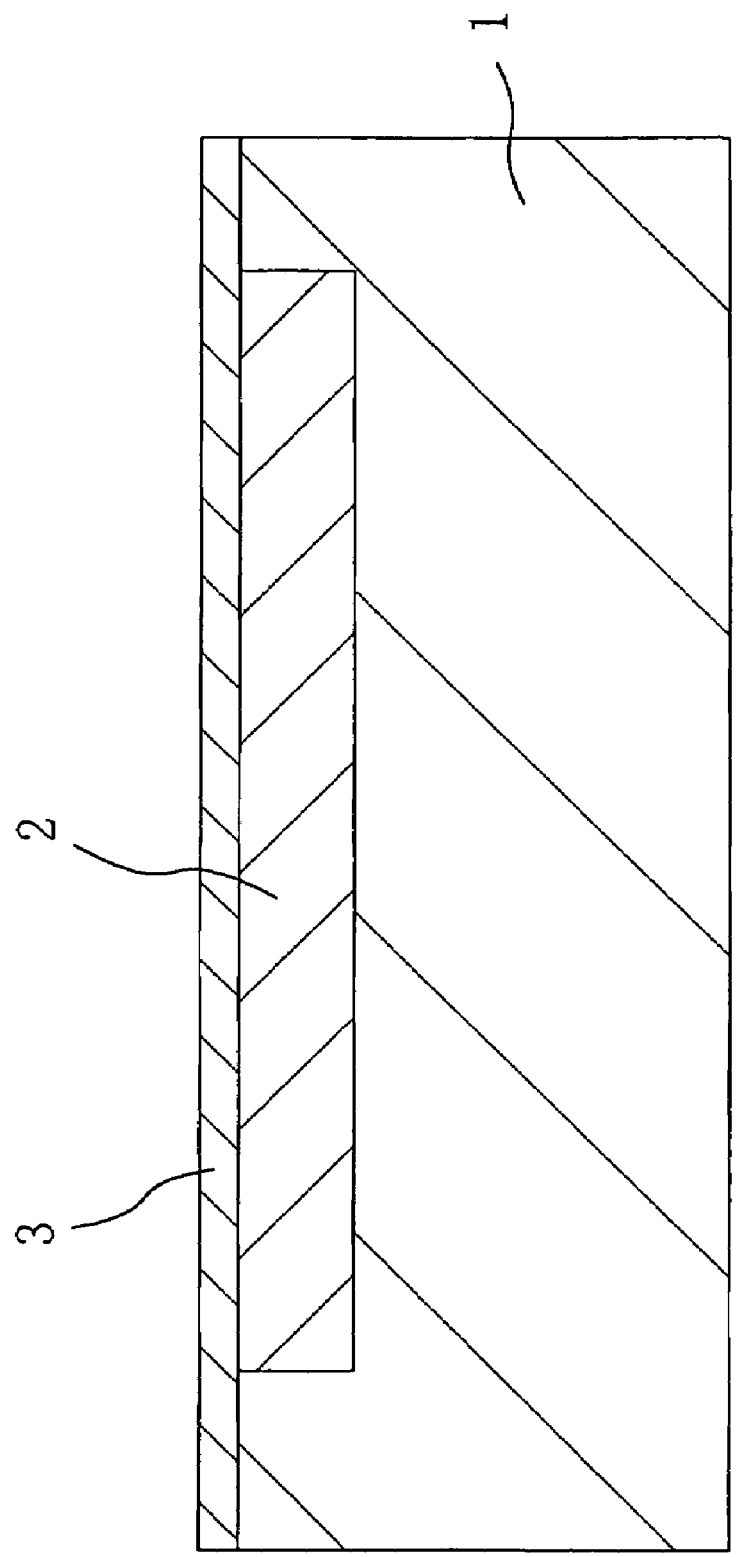
FIG. 2 is a cross-sectional view illustrating steps up to the step of forming a Si single crystalline layer in respective steps for fabricating the bipolar transistor of the first embodiment of the present invention.

First, as shown in FIG. 2, on a surface of an upper portion of a p-type Si substrate 1 of which the principal surface is the (001) plane, a resist film (not shown) having an opening corresponding to a region of the substrate in which an n-type sub-collector layer is to be formed is formed using photolithography. Next, using the resist film as an injection mask, arsenic (As) ions are implanted into the Si substrate 1 to form an n-type sub-collector layer 2 having a depth of about 1 µm in a region of the substrate in which a HBT is to be formed (which will be herein referred to as a "HBT forming region"). In this case, the concentration of As in the sub-collector layer 2 is about $6 \times 10^{19}$ cm$^{-3}$. Subsequently, a Si single crystalline layer 3 (a first semiconductor layer) is epitaxially grown on the Si substrate 1 while an n-type impurity is in-situ doped. The concentration of an n-type impurity in the Si single crystalline layer 3 is about $1 \times 10^{15}$ cm$^{-3}$.

Figure 3:
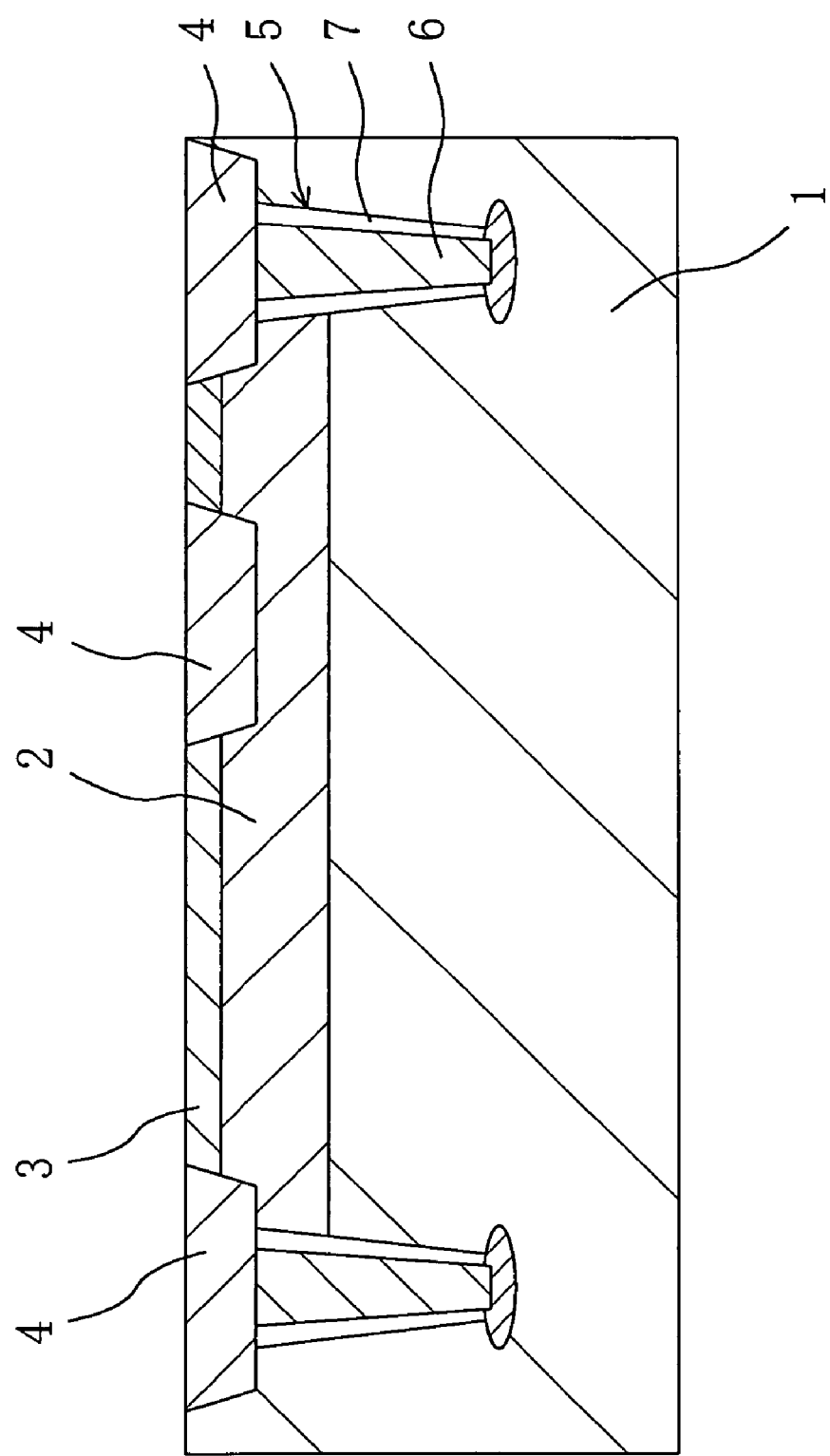
FIG. 3 is cross-sectional view illustrating the step of forming a trench in respective steps for fabricating the bipolar transistor of the first embodiment of the present invention.

Next, in the process step of FIG. 3, a shallow trench 4 which is filled with a silicon oxide film, a non-doped polysilicon film 6, and a deep trench 5 which is formed of a silicon oxide film 7 and surrounds the non-doped polysilicon film 6 are formed so as to together form as an isolation layer. The depths of the trenches 4 and 5 are about 0.3 µm and about 3 µm, respectively.

Figure 4:
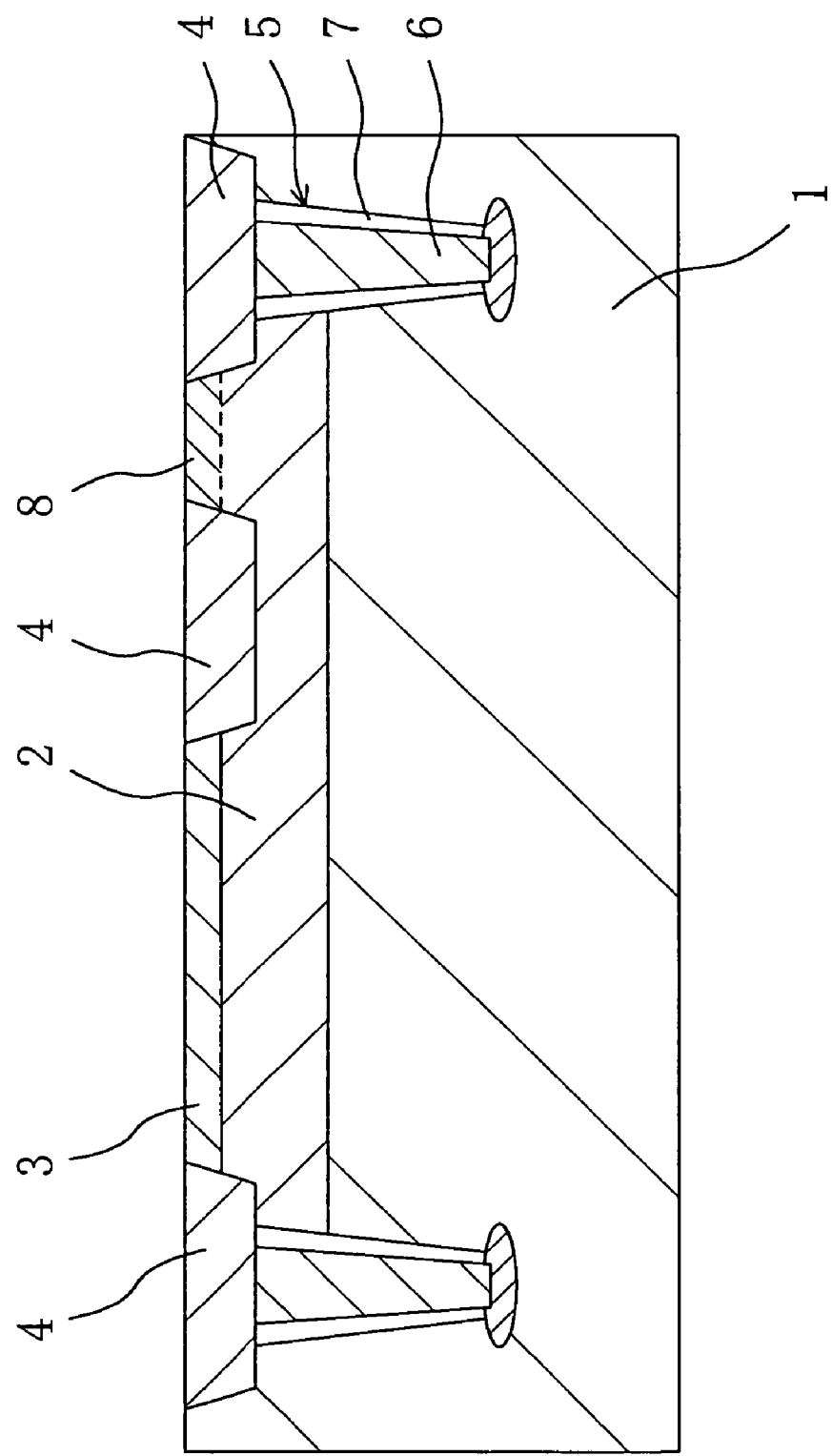
FIG. 4 is cross-sectional view illustrating the step of forming an n+ type collector lead layer in respective steps for fabricating the bipolar transistor of the first embodiment of the present invention.

Next, in the process step of FIG. 4, a resist film (not shown) having an opening corresponding to a region of the substrate in which an n+ type collector lead layer is to be formed is formed, and then using the resist film as an injection mask, phosphorus (P) ions are selectively implanted into the Si single crystalline layer 3 under the condition in which the acceleration energy is about 60 KeV and the dose is $3 \times 10^{15}$ cm$^{-2}$. Thereafter, the resist film is removed by oxygen plasma ashing. Subsequently, thermal treatment at 850° C. is performed for about 30 minutes to form an n+ type collector lead layer 8 between shallow trenches 4.

Next, using photolithography and ion implantation, arsenic ions are implanted into an upper portion of the n+ type collector lead layer 8 under the condition in which the acceleration energy is about 50 KeV and the dose is $3 \times 10^{15}$ cm$^{-2}$. Subsequently, thermal treatment, for example, at a temperature of about 1000° C. is performed for about 10–15 seconds to activate an impurity.

Figure 5:
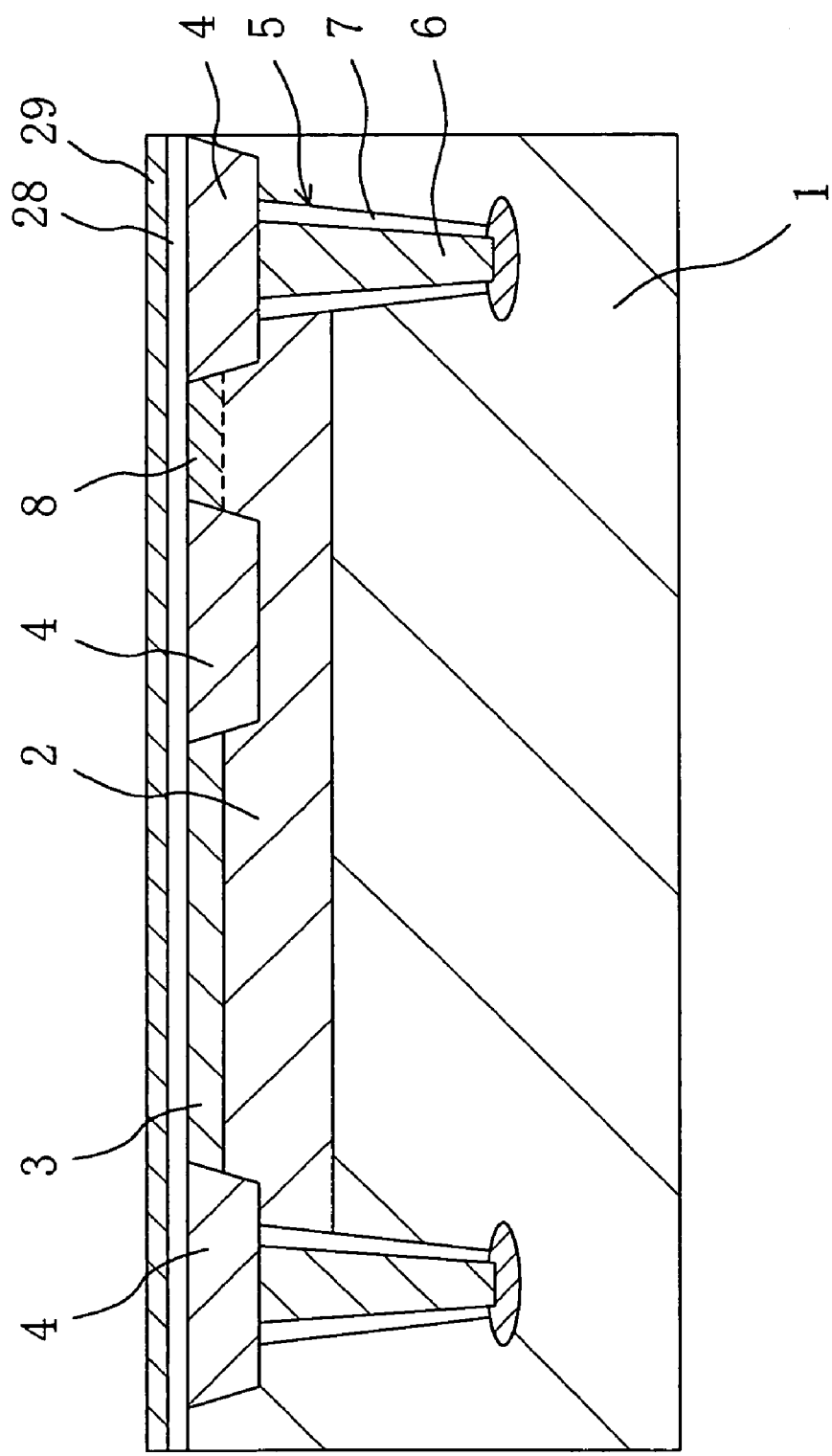
FIG. 5 is a cross-sectional view illustrating the step of depositing an oxide film and a polysilicon film for dividing an external base region in respective process steps for fabricating the bipolar transistor of the first embodiment of the present invention.

Next, in the process step of FIG. 5, an oxide film 28 having a thickness of about 50 nm is deposited over the substrate by low pressure CVD, and then a polysilicon film 29 having a thickness of about 100 nm is deposited over the oxide film 28 by low pressure CVD.

Figure 6:
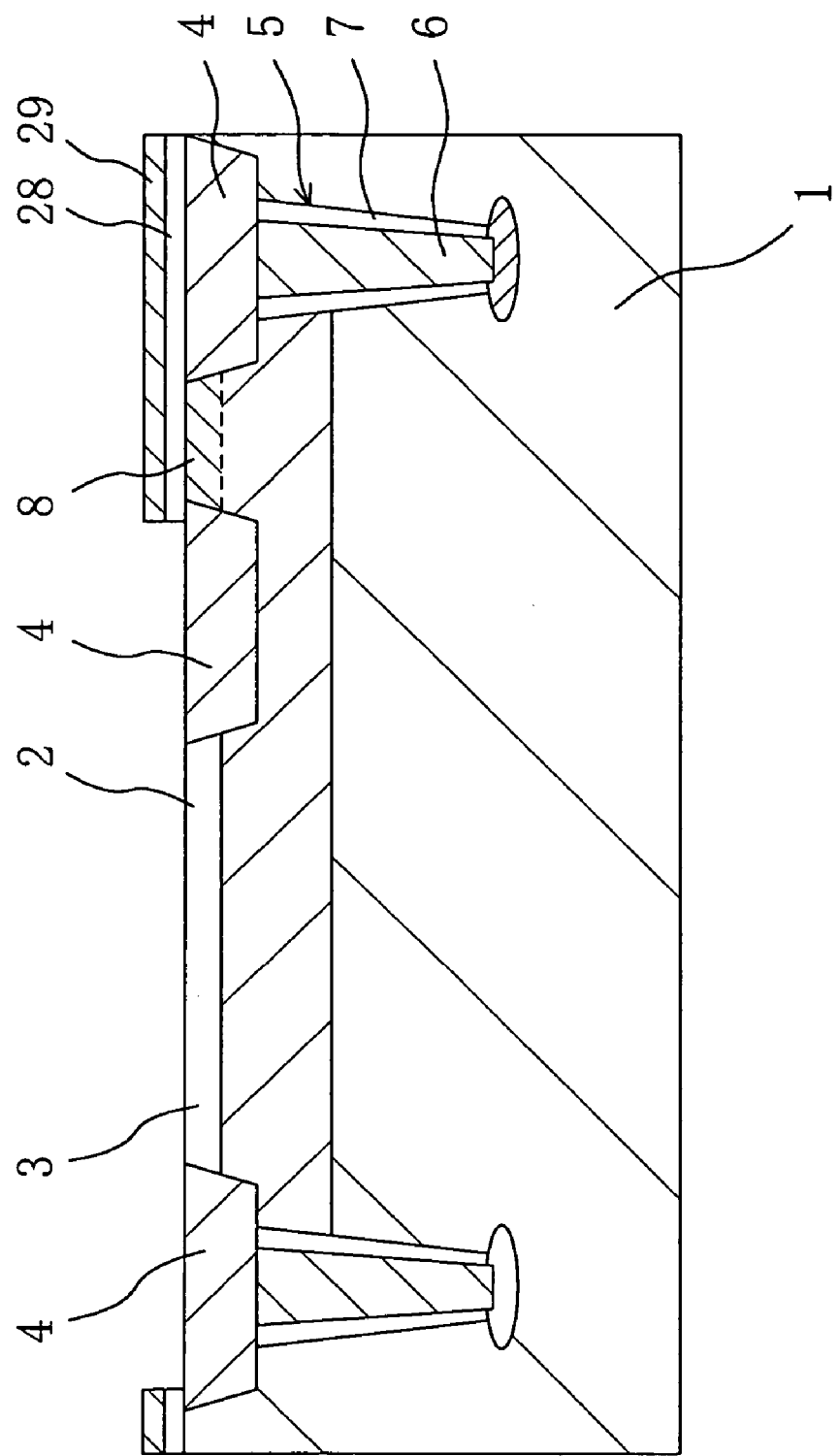
FIG. 6 is a cross-sectional view illustrating the step of performing ion implantation of an impurity for forming a collector layer in respective process steps for fabricating the bipolar transistor of the first embodiment of the present invention.

Next, in the process step of FIG. 6, a resist film (not shown) having an opening corresponding to the HBT forming region is formed using photolithography, and then the polysilicon film 29 is patterned by etching using the resist film as an etching mask to form an opening corresponding to a region of the substrate in which an external base layer is to be formed. Thereafter, to form a phosphorus profile of a collector, using the resist film and the polysilicon film 29 as injection masks, phosphorus ions are implanted into the Si single crystalline layer 3 through the oxide film 28 under the condition in which the acceleration energy is 280 KeV and the dose is about $5 \times 10^{13}$ cm$^{-3}$. Thus, a desired phosphorus profile for a collector is formed in the Si single crystalline layer 3. Next, the resist film is removed by oxygen plasma ashing, and then part of the oxide film 28 exposed through the opening of the polysilicon film 29 is removed using hydrofluoric acid, so that part of a surface of the phosphorus-doped Si single crystalline layer is exposed.

Figure 7:
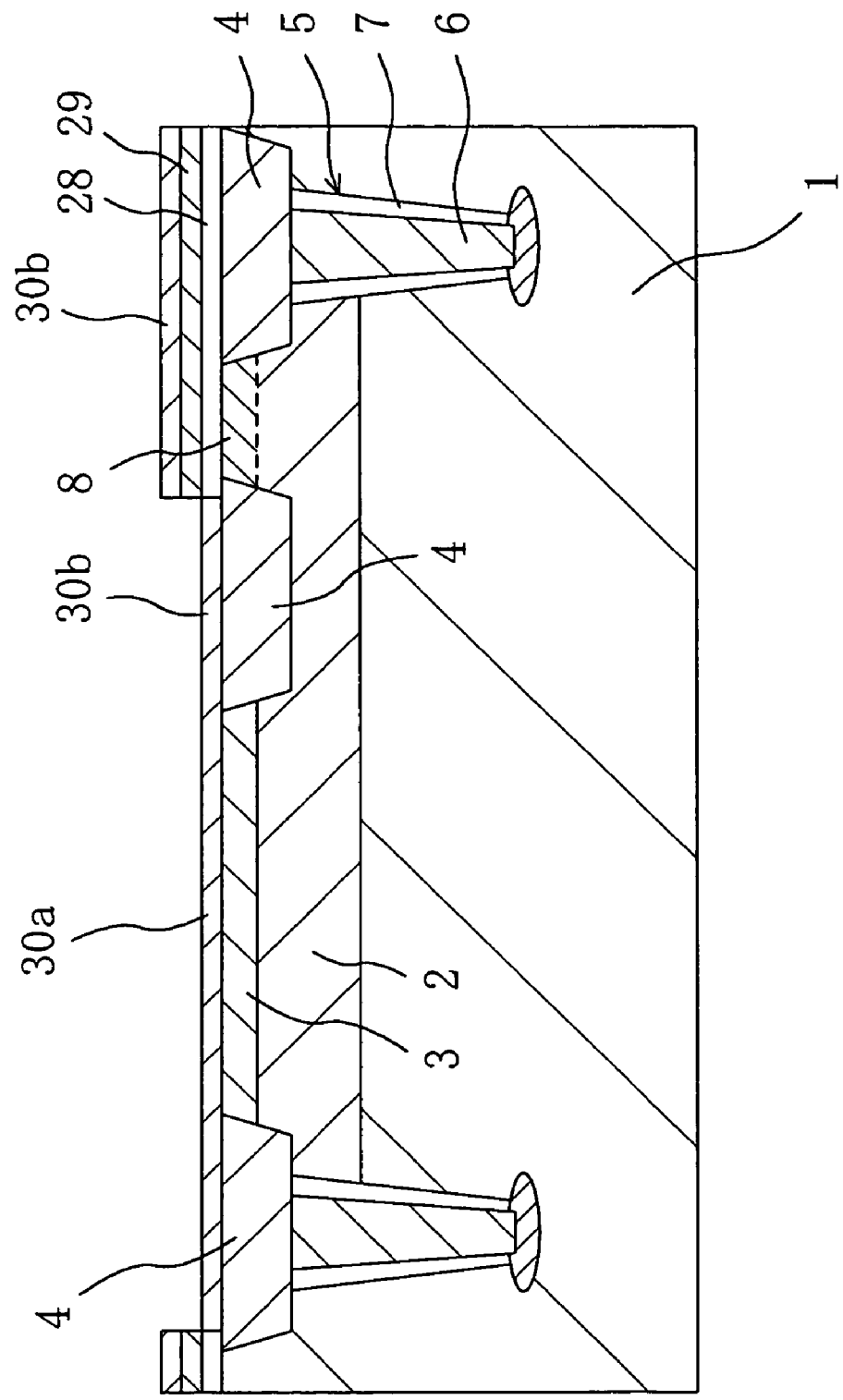
FIG. 7 is a cross-sectional view illustrating the step of forming a Si/SiGeC layer in respective process steps for fabricating the bipolar transistor of the first embodiment of the present invention.

Next, in the process step of FIG. 7, using UHV-CVD, after a Si buffer layer has been epitaxially grown on the substrate to a thickness of 60 nm, a SiGe film (a second semiconductor layer) is epitaxially grown and then a Si film (a third semiconductor layer) is epitaxially grown directly on the SiGe film to form a Si/SiGeC layer. In this process step, a Si/SiGeC layer 30a which includes a SiGeC film having a thickness of about 70 nm and a Si film having a thickness of about 30 nm and has a thickness of about 100 nm is grown on the Si single crystalline layer 3 and a polycrystalline Si/SiGeC layer 30b which includes a polycrystalline Si film having a thickness of about 30 nm, a polycrystalline SiGeC film having a thickness of 35 nm and a Si polycrystalline film having a thickness of about 15 nm and has a thickness of about 80 nm is grown on the shallow trench (oxide film) 4 and the polysilicon film 29. Moreover, boron is introduced into the SiGeC film by in-situ doping, so that the SiGeC film has become the p-type.

Here, in UHV-CVD in which a SiGeC film is epitaxially grown at a high vacuum, epitaxial growth takes place only on a surface of a film, and thus a growth rate is highly dependent on a plane direction. If this phenomenon is used, crystal growth speed differs between a surface of a Si single crystalline layer (e.g., the (100) plane) and each of surfaces of a polysilicon layer and an oxide film. Specifically, the growth rate is reduced on a surface of a polysilicon film in which many crystal directions exist or an insulating film, i.e., an amorphous layer. Experiment results show that on an polysilicon layer and an oxide film, the growth rate was about half of that on the (100) plane of a Si single crystalline layer. Also, on the Si film grown at a high vacuum after the SiGeC film has been formed, the growth rate was the same as that on the polysilicon layer and the oxide film. Accordingly, the thickness of the Si/SiGeC layer 30b is about 50 nm. In this manner, if UHV-CVD is used, the polycrystalline Si/SiGeC layer 30b to be a major part of the external base layer can be grown at a low growth rate. Thus, the polycrystalline SiGeC film having high electric resistance in the external base layer has a smaller thickness than that of a single crystal SiGeC film to be an intrinsic base layer. As a result, the intrinsic base layer and a silicide film to be part of an external base layer which is to be formed later are successively formed, and furthermore, a distance between the intrinsic base layer and the silicide film is reduced. Therefore, the performance of the bipolar transistor can be improved due to low base resistance.

Figure 8:
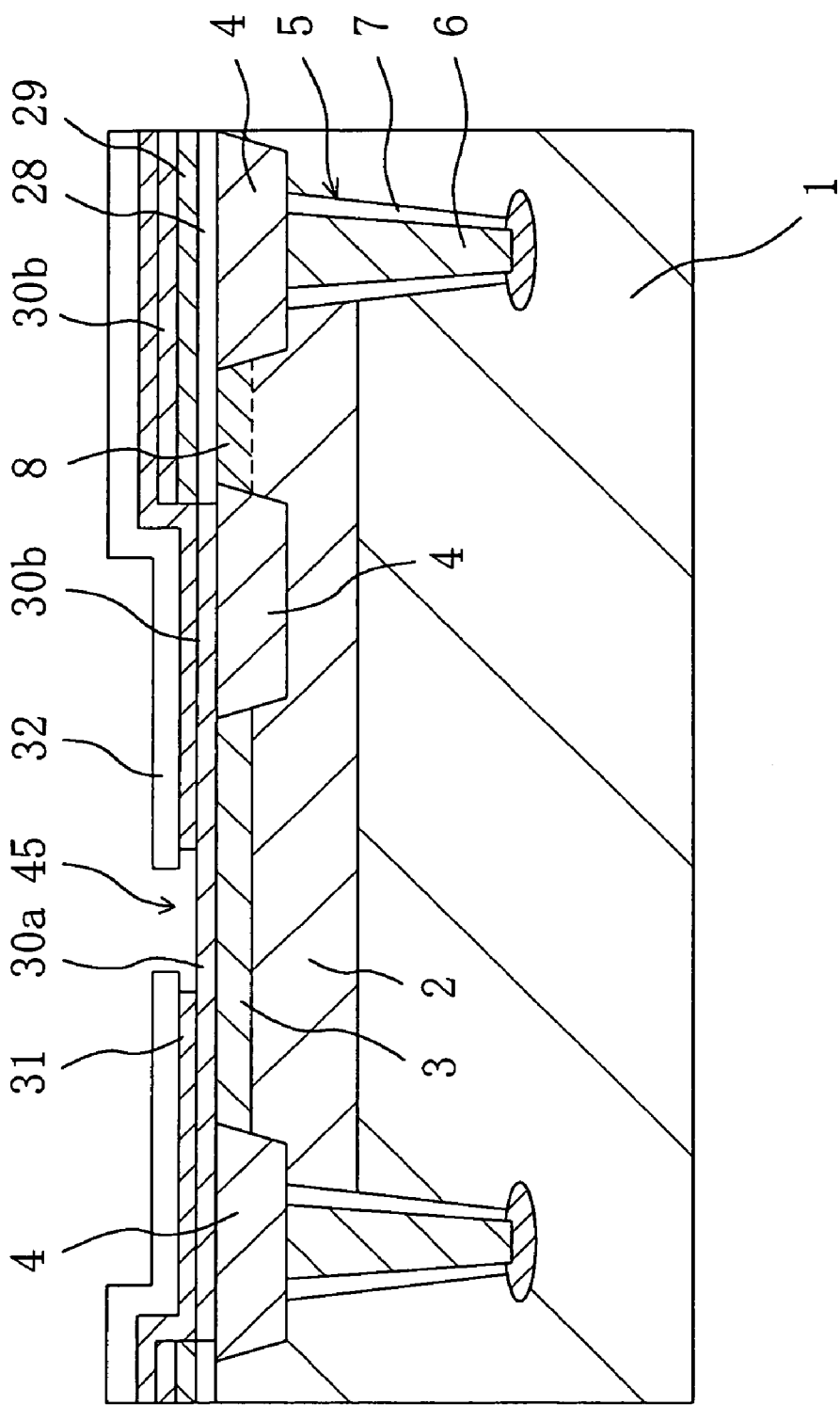
FIG. 8 is a cross-sectional view illustrating the step of forming an emitter opening portion in an oxide film and a polysilicon film in respective process steps for fabricating the bipolar transistor of the first embodiment of the present invention.

Next, in the process step of FIG. 8, an oxide film 31 having a thickness of about 30 nm and a polysilicon film 32 having a thickness of about 50 nm and containing phosphorus at a concentration of about $3 \times 10^{15}$ cm$^{-3}$ are successively deposited over the substrate by low pressure CVD. Thereafter, using photolithography, a resist film (not shown) having an opening corresponding to a region of the substrate in which an emitter is to be formed, and then the polysilicon film 32 is patterned by dry etching using the resist film as an etching mask to form an emitter opening portion 45. Thereafter, part of the oxide film 31 located in the emitter opening portion 45 is removed.

Figure 9:
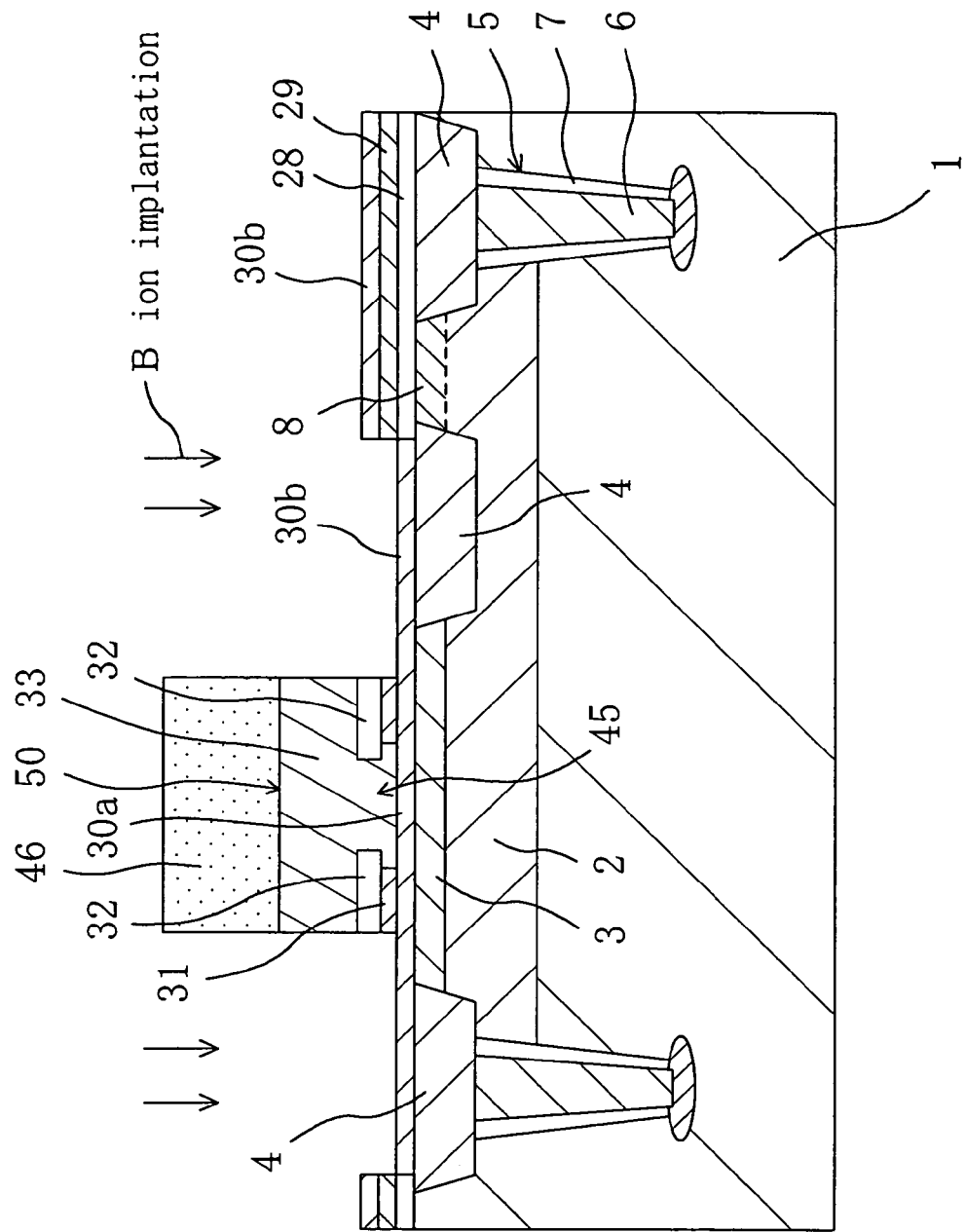
FIG. 9 is a cross-sectional view illustrating the step of forming an emitter electrode while implanting boron ions into a Si/SiGeC layer in respective process steps for fabricating the bipolar transistor of the first embodiment of the present invention.

Next, in the process step of FIG. 9, an n+ type polysilicon film 33 having a thickness of about 400 nm and containing an n-type impurity (phosphorus) at a concentration of about $1–5 \times 10^{20}$ cm$^{-3}$ is deposited over the substrate by low pressure CVD using in-situ doping. Subsequently, a resist film 46 is formed on the n+ type polysilicon film 33 by photolithography so as to cover an emitter electrode portion. Then, using the resist film 46 as an etching mask, the polysilicon films 32 and 33 are patterned by anisotropic etching to form an emitter electrode 50. Subsequently, using the resist film 46 and the emitter electrode 50 as etching masks, part of the oxide film 31 which is not covered with the emitter electrode 50 is removed by wet etching. The thickness of the polysilicon film 33 is preferably in the range between not less than 200 nm and not more than 500 nm, and more preferably not less than 300 nm in this range.

Next, to reduce the resistance of an external base, additional implantation of boron ions into the Si/SiGeC layers 30a and 30b is performed under the condition in which the acceleration energy is about 5 KeV and the dose is $2\times10^{15}$ cm$^{-3}$ in the substantially perpendicular direction with respect to a surface substrate (i.e., from a direction tilted by an angle which does not cause channeling).

Figure 10:
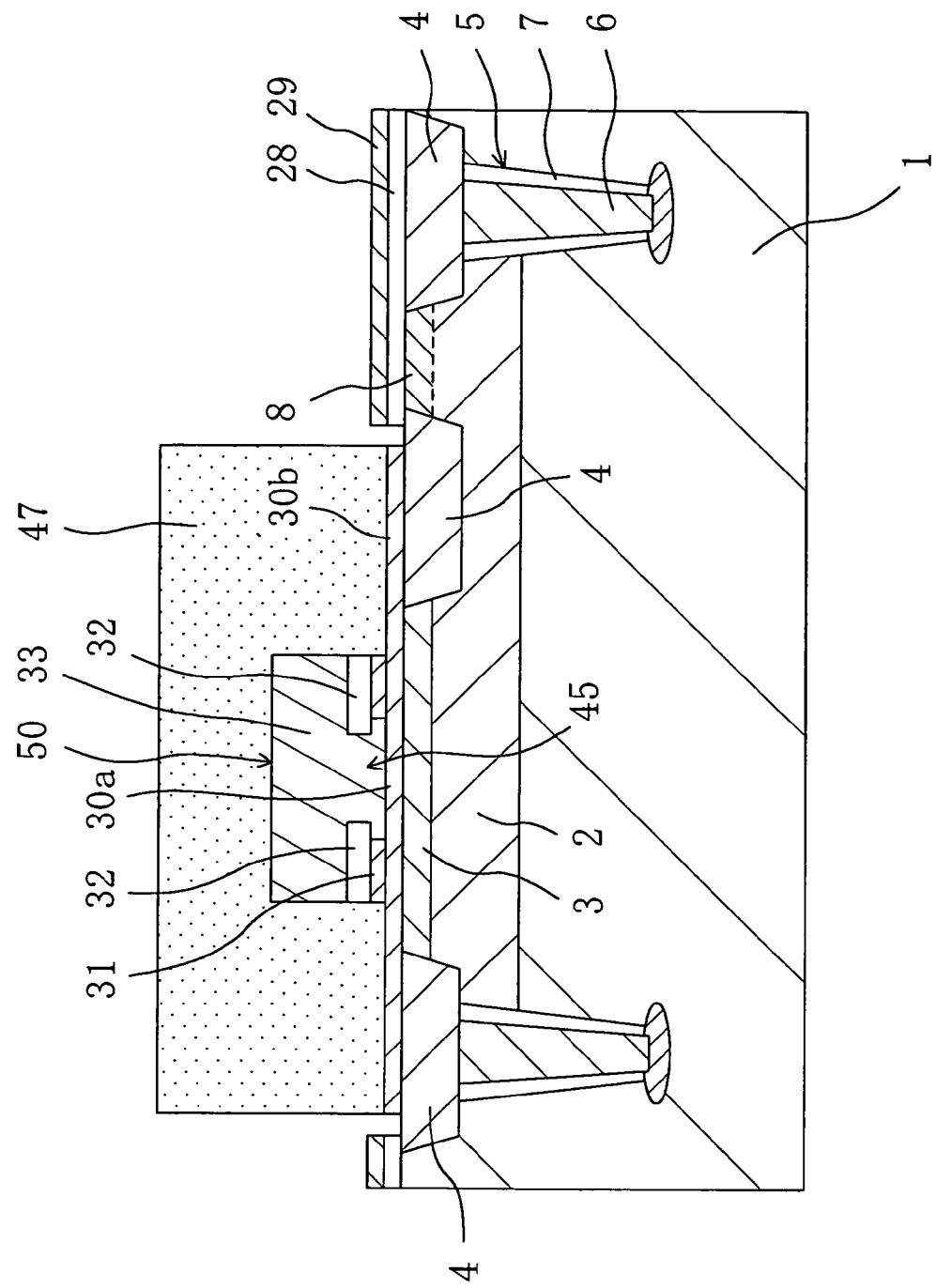
FIG. 10 is a cross-sectional view illustrating the step of patterning the Si/SiGeC layer in respective process steps for fabricating the bipolar transistor of the first embodiment of the present invention.

Next, in the process step of FIG. 10, the resist film 46 is removed by oxygen plasma ashing. Thereafter, a resist film 47 is formed by photolithography so as to cover the emitter electrode 50 and a region of the polycrystalline Si/SiGeC layer 30b which is to be part of an external base layer, and then using the resist film 47 as an etching mask, part of the polycrystalline Si/SiGeC layer 30b located outside of the external base layer is removed.

Figure 11:
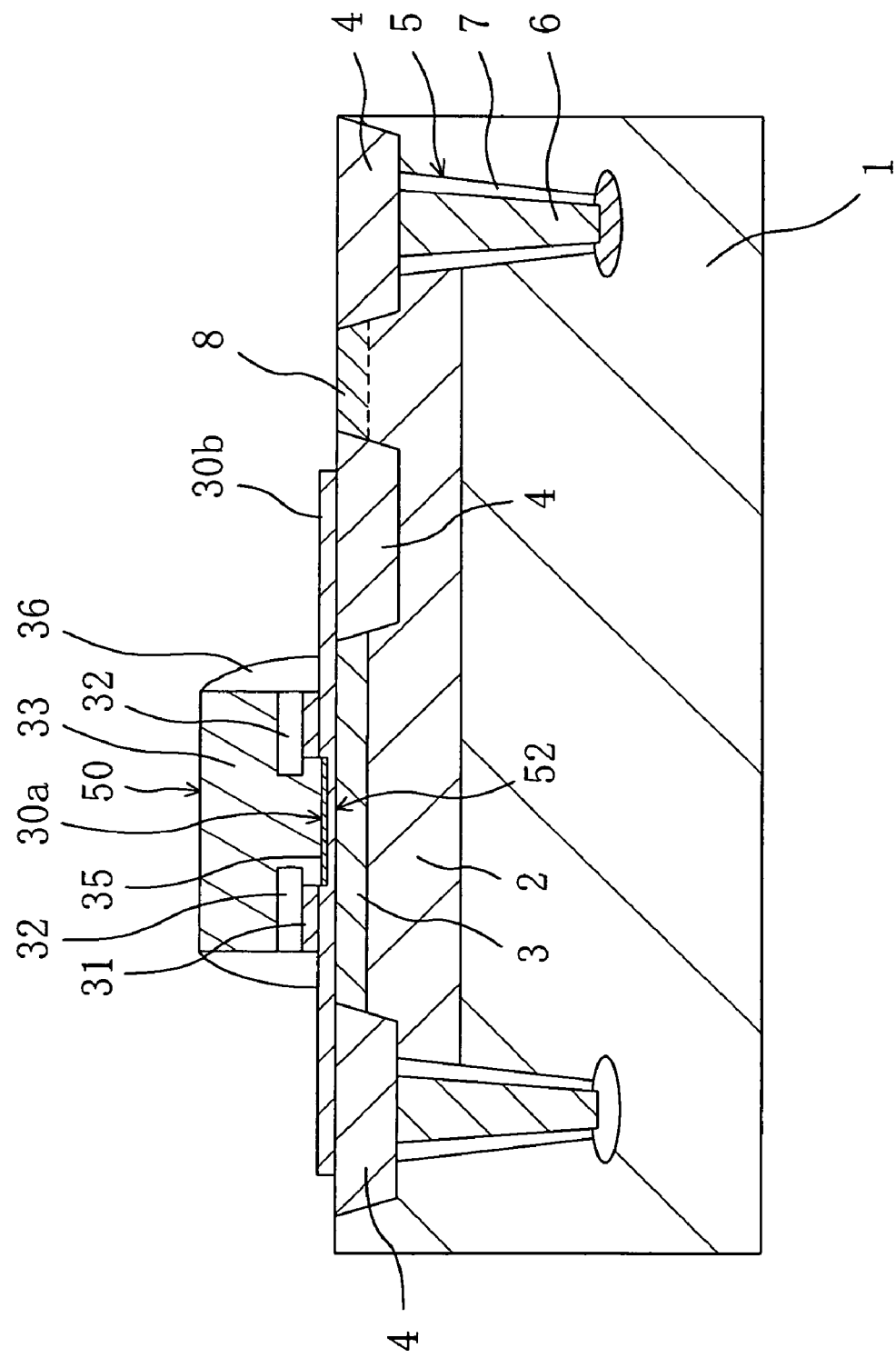
FIG. 11 is a cross-sectional view illustrating the step of forming an emitter layer and a sidewall in respective process steps for fabricating the bipolar transistor of the first embodiment of the present invention.

Next, in the process step of FIG. 11, an oxide film having a thickness of about 30–100 nm is deposited over the substrate by low pressure CVD. Thereafter, thermal treatment at a temperature of about 900° C. is performed for about 10–15 seconds to diffuse arsenic from the emitter electrode 50 in the Si film of the Si/SiGeC layer 30a. Thus, an emitter layer 35 is formed. Subsequently, an oxide film is deposited over the substrate, and then the oxide film is subjected to anisotropic etching, so that a sidewall 36 is formed on a side surface of the emitter electrode 50. At this time, the silicon layer is exposed at an upper surface of the emitter electrode 50 of the HBT, upper surfaces of the Si/SiGeC layers 30a and 30b and an upper surface of an n+ type collector lead layer 8.

Figure 12:
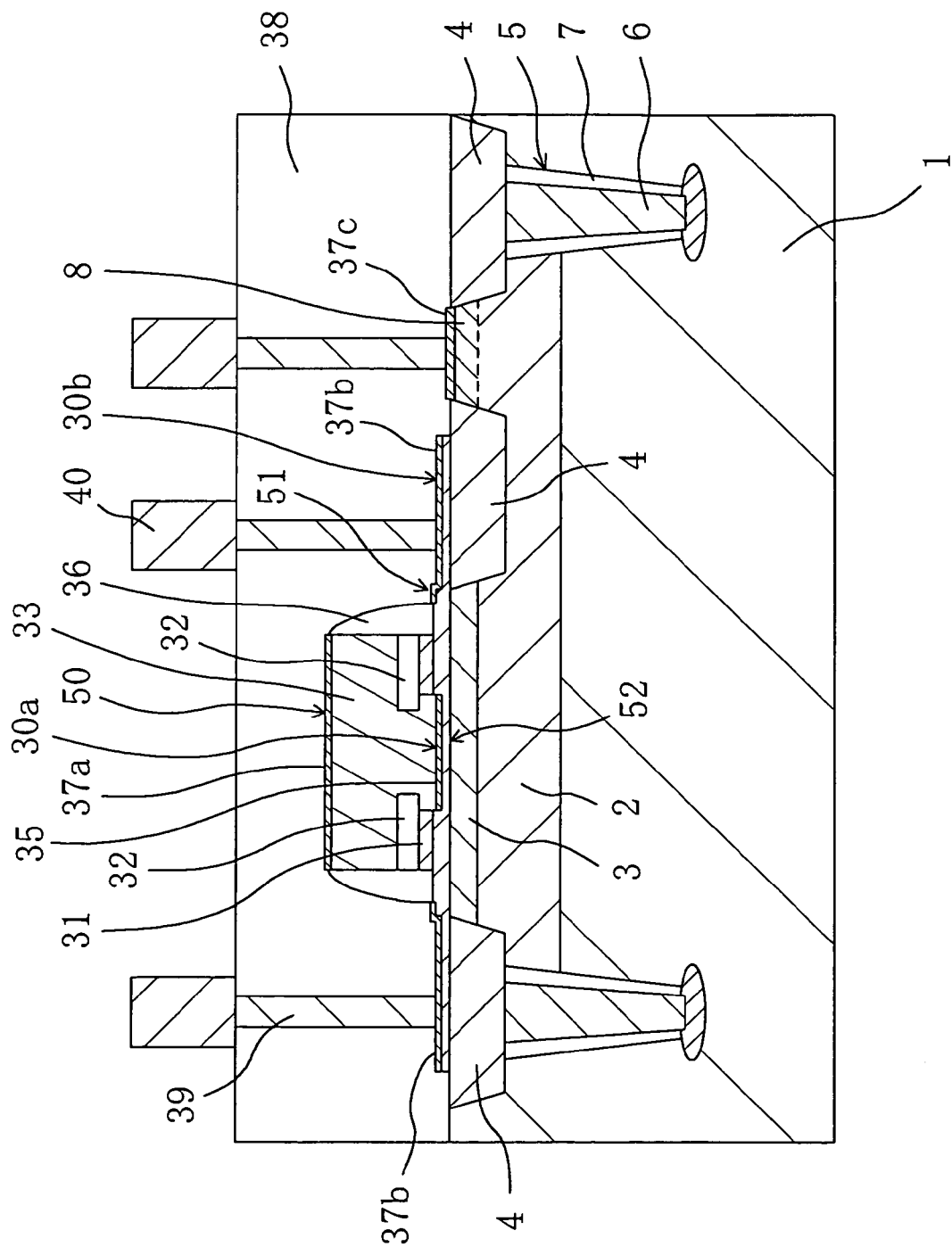
FIG. 12 is a cross-sectional view illustrating the step of forming a silicide layer in respective process steps for fabricating the bipolar transistor of the first embodiment of the present invention.

Next, in the process step of FIG. 12, a Co film is formed over the substrate by sputtering, and then Co and Si are brought into reaction with each other by heating. Thus, Co silicide layers 37a, 37b and 37c are formed so as to be located in an upper portion the emitter electrode 50 of the HBT, upper portions of the Si/SiGeC layers 30a and 30b and an upper portion of the n+ type collector lead layer 8. Thereafter, an unreacted layer in which Co and Si are not reacted with each other is removed, and then the Co silicide layers 37a, 37b and 37c are subjected to annealing, so that the resistances of the Co silicide layers 37a, 37b and 37c are reduced. Thus, an external base layer 51 including part of the Si/SiGeC layer 30a, the Si/SiGeC layer 30, and the Co silicide layer 37b.

In a subsequent process step, the process step of forming a standard multi-layer interconnect is used. Specifically, an interlevel insulating film 38 formed of an oxide film is deposited over the substrate, and then a via hole is formed so as to pass through the interlevel insulating film 38 and reach each of the respective Co silicide layers 37a, 37b and 37c of the emitter electrode 50, the external base layer 51 and the n+ type collector lead layer 8.

Thereafter, a W film is filled in each via hole to form a W plug 39, and then an aluminum alloy film is formed over the substrate by sputtering. The aluminum alloy film is patterned using a resist film having an opening corresponding to a predetermined region of the substrate as a mask. Thus, a metal interconnect 40 is formed so as to be connected to each W plug 39 and extend over the interlevel insulating film 38.

Note that in this embodiment, an impurity concentration profile in the Si single crystalline layer located from immediately under the base layer to the sub-collector layer is formed by a single phosphorus ion implantation. However, to optimize the impurity concentration profile, multiple-step ion implantation or self-aligned ion implantation using a mask for making an emitter opening (i.e., the polysilicon film 32 of FIG. 8) may be used.

According to this embodiment, the following effects can be achieved.

First, the emitter electrode 50 is formed of a polysilicon film having a thickness of about 400 nm. In the known bipolar transistor described in Reference 1, the thickness of a polysilicon film forming an emitter electrode is about 140 nm. In contrast, in this embodiment, the polysilicon film 33 forming the emitter electrode 50 has a very large thickness, i.e., a thickness of 400 nm.

The thickness of the emitter electrode 50 (the polysilicon film 33) is set so that boron ions implanted into the emitter electrode 50 and diffused therein in the process step of FIG. 9 do not reach to an emitter-base junction.

Moreover, with a large thickness of a polysilicon film for forming an emitter electrode, almost no recess corresponding to the emitter opening portion exists on an upper surface of the emitter electrode 50.

Figure 15:
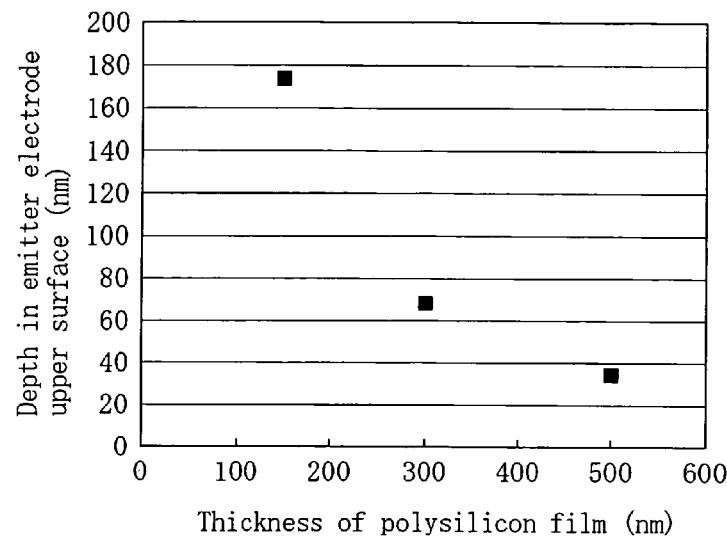
FIG. 15 is a graph showing the depth of a recess formed in an upper surface of the emitter electrode with respect to the thickness of a polysilicon film for an emitter electrode of the bipolar transistor of each of the first and second embodiments.

FIG. 15 is a view illustrating the depth of a recess on an upper surface of an emitter electrode with respect to the thickness of an emitter electrode polysilicon film. As shown in FIG. 15, when the thickness of the polysilicon film is about 150 nm, a deep recess is formed on the upper surface of the emitter electrode. With a deep recess in the upper surface of the emitter electrode 50, when the silicide layer 37c is formed, the thickness of the silicide film 37c is reduced. This might cause increase in contact resistance. On the other hand, in the emitter electrode 50 of this embodiment, the contact resistance can be reliably kept at a low level. In this case, to reliably keep the contact resistance with respect to the emitter electrode 50 at a low level, as shown in FIG. 15, the aspect ratio of the recess in the upper surface of the emitter electrode 50 is preferably 1/5 or less, and more preferably 1/10 or less. In this embodiment, the width of the emitter electrode 50 is about 0.7 μm and thus the thickness of polysilicon film 33 is preferably 200 nm or more, and more preferably 300 nm or more. On the other hand, the thickness of the interlevel insulating film 38 is about 1 μm. Thus, if insulating properties and workability are taken into consideration, the thickness of the polysilicon film is preferably 500 nm or less.

Moreover, in the fabrication method of this embodiment, a polycrystalline SiGe film to be an external base can be formed at low growth rate using UHV-CVD. Thus, the thickness of the high-resistant polycrystalline Si/SiGeC layer 30b in the external base layer 51 is smaller than that of the single crystalline Si/SiGeC layer 30a in the intrinsic layer 52. As a result, the distance between the intrinsic base layer 52 and the silicide layer 37b of the external base layer 51 is reduced. Therefore, with reduced base resistance, the performance of the bipolar transistor can be improved.

Second Embodiment

Figure 13:
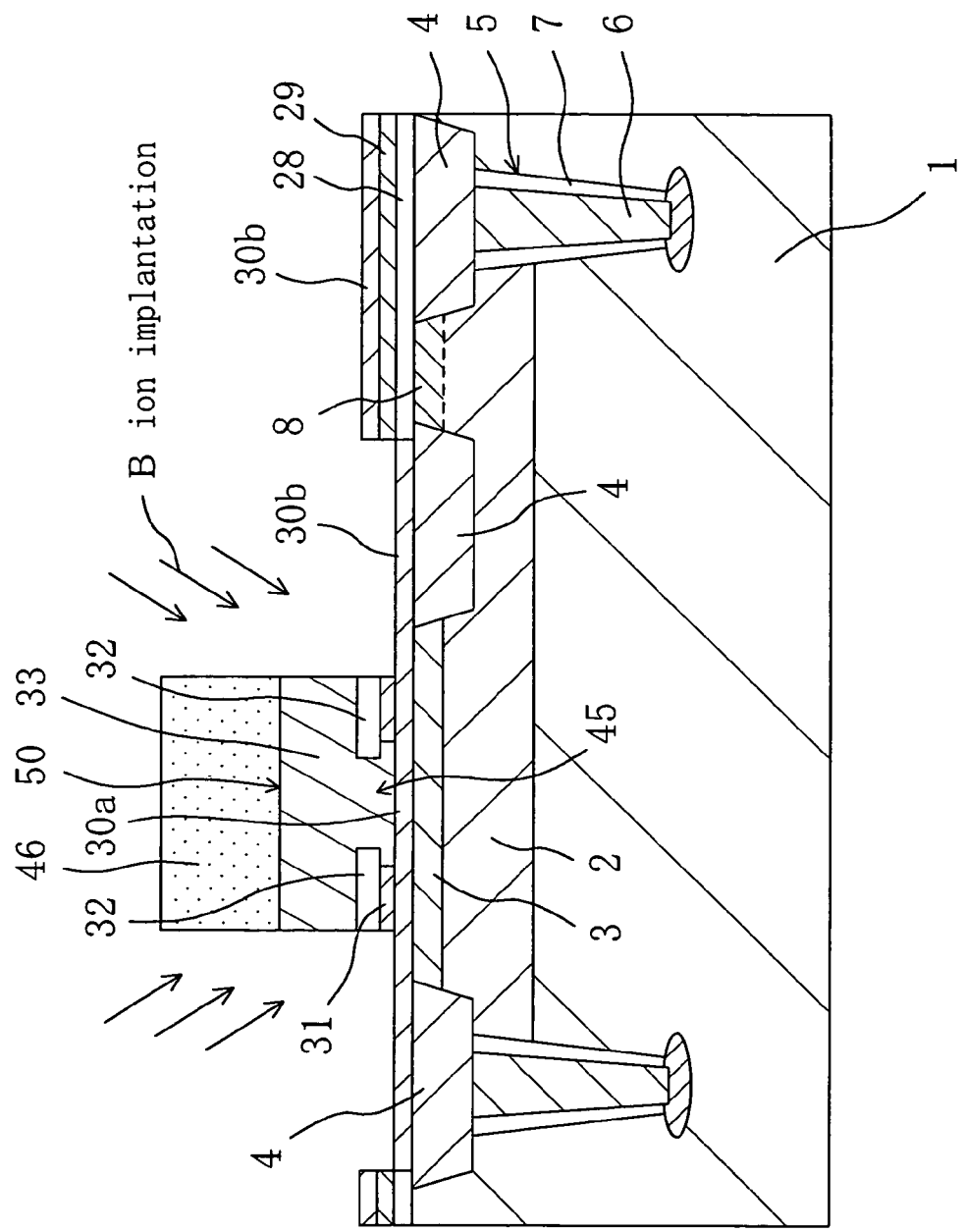
FIG. 13 is a cross-sectional view illustrating the step of performing oblique ion implantation in respective process steps for fabricating the bipolar transistor according to a second embodiment of the present invention.
Figure 14:
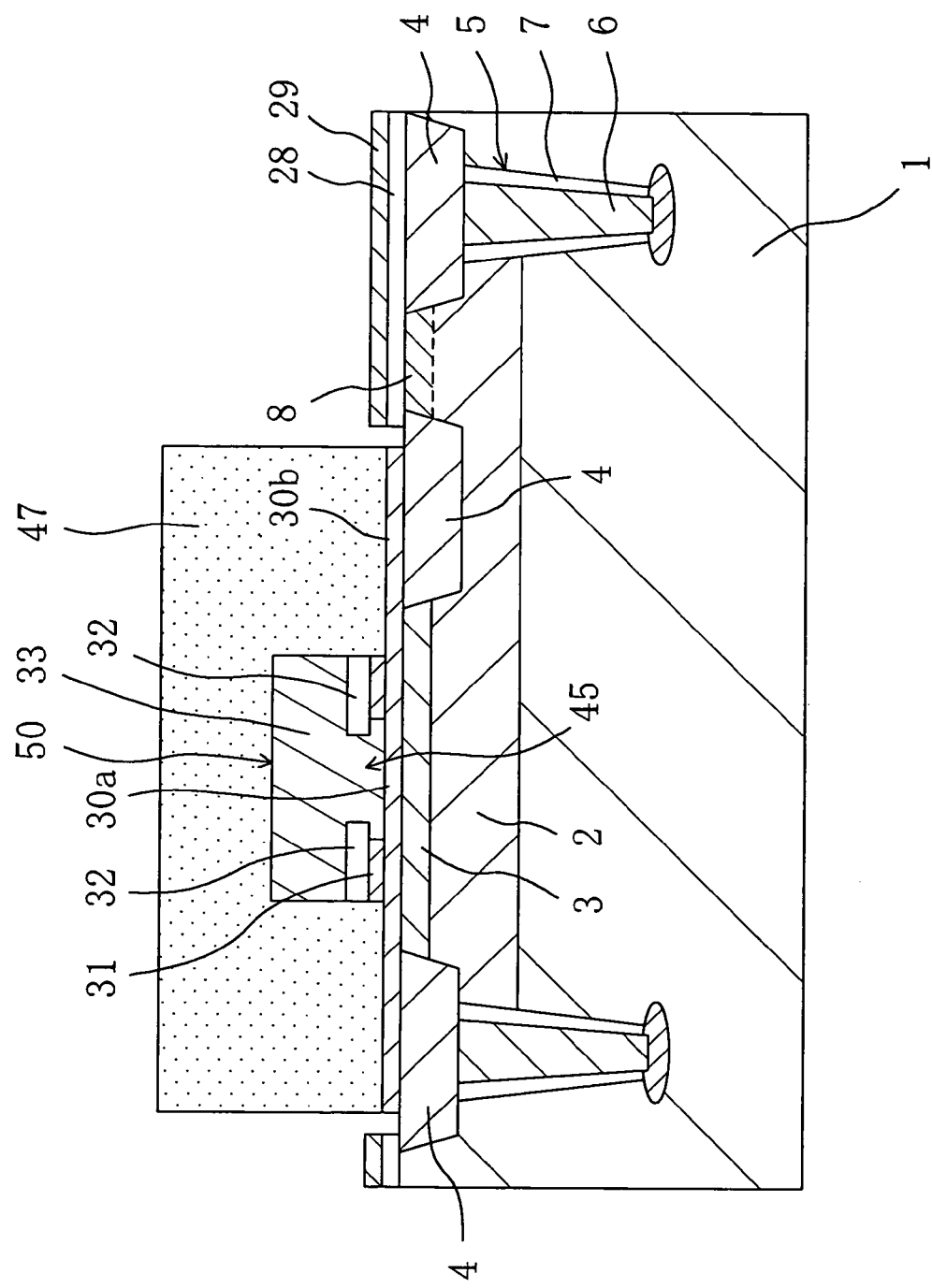
FIG. 14 is a cross-sectional view illustrating the step of patterning a Si/SiGeC layer in respective process steps for fabricating the bipolar transistor of the second embodiment of the present invention.

Hereinafter, a second embodiment of the present invention will be described with reference to the accompanying drawings. FIGS. 13 and 14 are cross-sectional views illustrating respective steps for fabricating a bipolar transistor according to the second embodiment of the present invention.

In this embodiment, the process steps of FIGS. 1 through 8 (i.e., from the process steps of forming a sub-collector layer 2 in a p-type Si substrate 1 to the process step of forming an emitter opening) are also performed.

Next, in this embodiment, the process step of FIG. 13 is performed, instead of the process step of FIG. 9. Specifically, subsequently to forming of the emitter electrode 50 by patterning the polysilicon film 33, the oxide film 31 is patterned with the resist film 46 left by wet etching. Thereafter, the oblique ion implantation step of implanting in which, boron ions into the Si/SiGeC layers 30a and 30b from the direction tilted by about 25 degrees from the perpendicular direction with respect to the substrate is performed four times while rotating the substrate by 90 degrees at a time (4-step-implantation). Thus, boron is introduced in a region of the Si/SiGeC layer 30a located under the oxide film 31, i.e., a region thereof closer to the intrinsic base layer 52 than an end portion of the emitter electrode 50. In this case, the injection energy is 10 KeV the total dose of 4 ion implantations is about $1.5 \times 10^{14}$ cm$^{-3}$.

Furthermore, to reduce the resistance of the external base layer with the resist film 46 left, additional boron ion implantation is performed in the substantially perpendicular direction (i.e., a direction tilted by an angle which does not cause channeling) under the condition in which the acceleration energy is about 5 KeV and the dose is $2 \times 10^{15}$ cm$^{-3}$.

Next, in the process step of FIG. 14, the resist film 46 is removed by oxygen plasma ashing. Thereafter, a resist film 47 is formed by photolithography so as to cover the emitter electrode 50 and a region of the polycrystalline Si/SiGeC layer 30b which is to be part of an external base layer, and then, using the resist film 47 as a mask, part of the polycrystalline Si/SiGeC layer 30b located further outside than the external base and part of the oxide film 29 located under the part are removed. Thus, an external base layer 51 is formed in the same manner as in the first embodiment. Thereafter, the same process steps as those of FIGS. 10 through 12 of the first embodiment are performed.

According to this embodiment, as boron ion implantation into the external base portion, oblique ion implantation in which ions are implanted into the Si/SiGeC layers 30a and 30b from a direction tilted from the perpendicular direction with respect to the substrate principal surface is performed. Thus, boron can be introduced into a region of the Si/SiGeC layer 30a, i.e., a high-resistant portion of the external base layer 51, located under the oxide film 31. That is, boron can be introduced into a region of the Si/SiGeC layer 30a closer to the intrinsic base layer 52 than an end portion of the emitter electrode 50. Accordingly, the base resistance can be reduced. Moreover, if in terms of production process, a tilted angle in the oblique implantation is appropriately adjusted (e.g., to be 25 degrees), the shape of an emitter electrode can be determined in view of workability without paying much attention on high-concentration boron diffusion in the lateral direction from the external base layer 51 to an emitter-base junction portion (i.e., a boundary region between the emitter layer 35 and the intrinsic base layer 52), which influences electric properties. Accordingly, the yield can be improved and the present invention can be applied to a large scale integrated circuit. Therefore, high-speed operation characteristic and high current driving ability can be achieved.

On the other hand, by performing oblique ion implantation of an impurity, a p-type impurity, i.e., boron can be introduced into the emitter electrode 50 containing an n-type impurity. Therefore, if a polysilicon film forming an emitter electrode has a small thickness, adverse effects to device properties are concerned. For example, boron might completely pass through the polysilicon film and the resistance of the emitter electrode might be increased. To cope with such adverse effects, in the present invention, the thickness of a polysilicon film is set to be larger than that in a regular device, i.e., about 400 nm, so that the total amount of an n-type impurity is large. Therefore, it is possible to reduce adverse effects such as pass-through of boron and increase in resistance. That is, in this embodiment, the thickness of the emitter electrode 50 (the polysilicon film 33) is set so that boron ions implanted into the emitter electrode 50 and diffused therein in the process step of FIG. 13 do not reach to an emitter-base junction.

Figure 16:
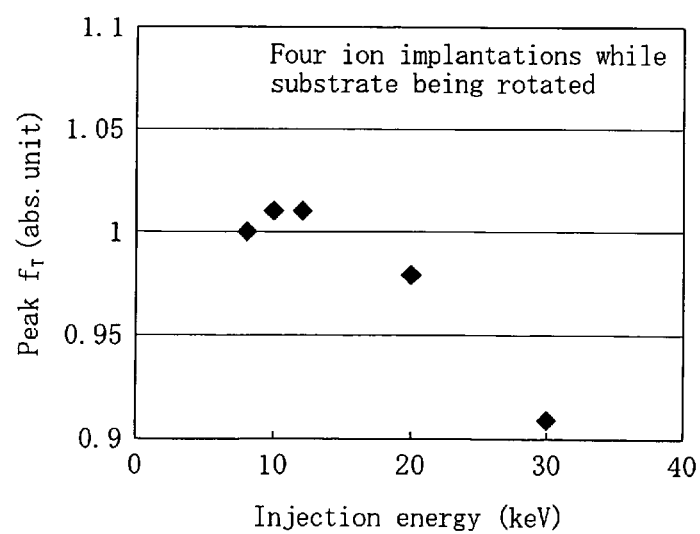
FIG. 16 is a graph showing the relationship between peak cutoff frequency of a bipolar transistor and injection energy when oblique ion implantation is performed under the condition described in the second embodiment.

FIG. 16 is a graph showing the relationship between injection energy and peak cutoff frequency $f_T$ for a bipolar transistor when oblique ion implantation is performed from the direction tilted by an angle of 25 degrees in forming a base under the condition of this embodiment.

As shown in FIG. 16, the peak cutoff frequency $f_T$ starts decreasing when the injection energy exceeds 20 KeV. A reason for this seems to be an increase in the boron concentration around the emitter layer. On the other hand, when the injection energy is less than 6 KeV, the peak cutoff frequency $f_T$ is reduced.

In this case, if boron ions are implanted under the condition in which the tilted angle of the oblique ion implantation is 25 degrees and the acceleration energy is 20 KeV, boron ions are implanted to a depth of 70 nm, so that boron ions are diffused to a point of about 30 nm in the lateral direction. Accordingly, if an injection condition which allows ion diffusion in the range from an end portion of the emitter electrode 50 to a point of 30 nm or less, effects of this embodiment can be achieved. On the other hand, if boron ions are implanted under the condition in which the tilted angle of the oblique ion implantation is 25 degrees and the acceleration energy is 6 KeV, boron ions are implanted to a depth of 40 nm, so that boron ions are diffused to a point of about 17 nm in the lateral direction. Therefore, under an injection condition which allows ion diffusion in the range from an end portion of the emitter electrode 50 to a point of 30 nm or less, effects of the present invention can be achieved. Note that in this embodiment, a distance between an end of the emitter and an outer end of the emitter electrode is designed to be 0.25 μm in terms of processing.

Moreover, assume that a distance obtained by (boron trajectory)+(6×standard deviation) is considered to be a safety distance at which boron introduced through oblique ion implantation does not influence the operation of a base-emitter junction portion. When the injection energy is 20 KeV, the safety distance is 230 nm. Therefore, when variation in performances is taken into consideration, a dimension of the emitter electrode in the lateral direction is preferably designed to be a distance equal to or larger than 230 nm from the emitter-base junction portion. Also, the distance in the lateral direction which boron diffusion reaches varies according to variation in an injection energy and a dose of boron in ion implantation and a dimension of the emitter electrode or the emitter layer in the lateral direction is changed due to the design of the device. Then, it is preferable to set conditions for the acceleration energy and the tilted angle when oblique ion implantation is performed so that a distance of 230 nm or more from the emitter-base junction portion is ensured.

Moreover, in the fabrication method of this embodiment, a polycrystalline SiGe film to be an external base can be formed at a low growth rate using UHV-CVD. Accordingly, the thickness of the high-resistant polycrystalline Si/SiGeC layer 30b in the external base layer 51 is smaller than that of the single crystalline Si/SiGeC layer 30a in the intrinsic base layer 52. As a result, a distance between the intrinsic base layer 52 and the silicide layer 37b of the external base layer 51 is reduced. Therefore, the bipolar transistor can be improved by a reduced base resistance.

Note that in this embodiment, the thickness of a polysilicon film forming an emitter electrode and the dimension of the emitter electrode in the lateral direction are the same as those in the first embodiment. That is, the thickness of a polysilicon film forming an emitter electrode and the dimension of the emitter electrode in the lateral direction are set to be much larger than those of the known bipolar transistor. Accordingly, the effect of reliably maintaining the contact resistance against the emitter electrode 50 at a low level and like effects can be achieved as in the first embodiment.

In each of the embodiments, a bipolar transistor including a Si/SiGeC hetero junction has been described. However, even if a SiGeC film which does not contain C or a $Si_{1-y}C_y$ film containing a very small amount of C (0.1–0.3% in composition ratio) is used, instead of a SiGeC film, basic effects of each of the embodiments can be achieved.

Moreover, although in each of the embodiments, the polysilicon film 32 containing phosphorus and having an emitter opening portion is formed on the oxide film 31 having an emitter opening portion, the polysilicon film 32 is not necessarily provided. However, with the polysilicon film 32 containing an impurity of the same conductive type as that of the emitter electrode, diffusion (pass-through) of boron ions implanted into the emitter electrode in the downward and inward directions can be advantageously prevented.

Moreover, in each of the embodiments, the emitter electrode formed of a polysilicon film is provided. However, the emitter electrode may be formed of a polycrystalline SiGe film.

Moreover, instead of the polysilicon film 32, a polycrystalline SiGe film or a polycrystalline SiGeC film may be provided.

The bipolar transistor of the present invention can be utilized as a transistor for amplifying a high frequency signal, a power transistor and like transistor, used in mobile communication device or like communication device.

What is claimed is:

1. A method for fabricating a bipolar transistor, comprising the steps of:
   a) epitaxially growing on a first semiconductor layer of a first conductive type surrounded by isolation layers, a second semiconductor layer having a different band gap from that of the first semiconductor layer and containing an impurity of a second conductivity type so as to extend between the isolation layers;
   b) epitaxially growing on the second semiconductor layer, a third semiconductor layer having a different band gap from that of the second semiconductor layer;
   c) forming on the third semiconductor layer, an insulating film having an emitter opening portion;
   d) forming on the third semiconductor layer and the insulating film, a polysilicon layer containing an impurity of the first conductivity;
   e) patterning the polycrystalline layer and the insulating film to form an emitter electrode; and
   f) implanting ions of an impurity of the second conductive type into the second and third semiconductor layers from a direction tilted from a perpendicular direction with respect to a surface of a substrate using the emitter electrode and the insulating film as masks,
   wherein in the step c), the insulating film is in contact with the upper surface of the third semiconductor layer.

2. The method of claim 1, further comprising the step of g) drive-in-diffusing an impurity of the first conductive type from the emitter electrode into the third semiconductor layer to form an emitter layer in a region of the third semiconductor layer located under the emitter opening portion,
   wherein in the step f), ion implantation of an impurity of the second conductive type is performed four times, with the substrate rotating by 90 degrees at a time.

3. The method of claim 1, further comprising: after the step f),
   the step h) of forming an insulator sidewall on side surfaces of the emitter electrode and the insulating film; and
   the step i) of siliciding upper portions of the third semiconductor layer and the emitter electrode using the insulator sidewall as a mask.

4. The method of claim 1,
   wherein the first semiconductor layer has a Si single composition, and
   wherein in the step a), the second semiconductor layer having a SiGe or SiGeC mixed crystal composition is grown.

5. The method of claim 1, wherein in the steps a) and b), a film thickness of the second and third semiconductor layers, which are polycrystalline and serve as an external base layer over the isolation layers, is made thinner than a thickness of the second and third semiconductor layers, which are single crystalline and serve as an intrinsic base layer over the first semiconductor layer, by using UHV-CVD.

6. The method of claim 1, wherein in the step f), a thickness of the emitter electrode is such that a concentration of the impurity of the second conductivity type, the impurity being implanted into the emitter electrode, is low under the emitter electrode.

7. The method of claim 1, wherein the emitter electrode consists of a first polycrystalline semiconductor film and a second polycrystalline semiconductor film, and the polycrystalline layer is the second polycrystalline semiconductor film,
   wherein the step c) includes the steps of;
   c1) successively depositing on the third semiconductor layer, the insulating film and the first polycrystalline semiconductor film containing an impurity of a first conductivity type in this order;
   c2) forming the emitter opening portion by patterning the first polycrystalline semiconductor film; and
   c3) removing the insulating film inside the emitter opening portion, and
   wherein in the step d), the second polycrystalline semiconductor film containing an impurity of a first conductivity type is formed on the third semiconductor layer and the first polycrystalline semiconductor film.

8. The method of claim 7, wherein in the step d), the second polycrystalline semiconductor layer has a thickness of not less than 300nm and not more than 500nm.

* * * * *